United States Patent
Bergbauer et al.

(10) Patent No.: US 11,018,277 B2
(45) Date of Patent: May 25, 2021

(54) SEMICONDUCTOR LAYER SEQUENCE AND METHOD FOR PRODUCING A SEMICONDUCTOR LAYER SEQUENCE

(71) Applicant: OSRAM Opto Semiconductors GmbH, Regensburg (DE)

(72) Inventors: Werner Bergbauer, Windberg (DE); Lise Lahourcade, Regensburg (DE); Jürgen Off, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/340,066

(22) PCT Filed: Oct. 24, 2017

(86) PCT No.: PCT/EP2017/077126
§ 371 (c)(1),
(2) Date: Apr. 5, 2019

(87) PCT Pub. No.: WO2018/077855
PCT Pub. Date: May 3, 2018

(65) Prior Publication Data
US 2020/0119227 A1    Apr. 16, 2020

(30) Foreign Application Priority Data
Oct. 25, 2016    (DE) .................... 102016120335.1

(51) Int. Cl.
*H01L 33/12*    (2010.01)
*H01L 33/00*    (2010.01)
(Continued)

(52) U.S. Cl.
CPC .......... *H01L 33/12* (2013.01); *H01L 33/007* (2013.01); *H01L 33/0025* (2013.01); *H01L 33/06* (2013.01); *H01L 33/32* (2013.01)

(58) Field of Classification Search
CPC ... H01L 33/12; H01L 33/0025; H01L 33/007; H01L 33/06; H01L 33/32;
(Continued)

(56) References Cited

U.S. PATENT DOCUMENTS 6,515,308 B1    2/2003    Kneissl et al.
9,806,224 B2    10/2017    Bergbauer et al.
(Continued)

FOREIGN PATENT DOCUMENTS

DE    19905517 A1    12/1999
EP    1786044 A1    5/2007
(Continued)

*Primary Examiner* — Shahed Ahmed
(74) *Attorney, Agent, or Firm* — Slater Matsil, LLP

(57) ABSTRACT

A semiconductor layer sequence and a method for producing a semiconductor layer sequence are disclosed. In an embodiment a semiconductor layer sequence includes a first nitridic compound semiconductor layer, an intermediate layer, a second nitridic compound semiconductor layer and an active layer, wherein the intermediate layer comprises an AlGaN layer with an Al content of at least 5%, wherein the second nitridic compound semiconductor layer has a lower proportion of Al than the AlGaN layer such that relaxed lattice constants of the AlGaN layer of the intermediate layer and of the second nitridic compound semiconductor layer differ, wherein the second nitridic compound semiconductor layer and the active layer are grown on the intermediate layer in a lattice-matched manner, wherein the active layer comprises one or more layers of AlInGaN, and wherein an In content in each of the layers of AlInGaN is at most 12%.

19 Claims, 6 Drawing Sheets

(51) Int. Cl.
*H01L 33/06* (2010.01)
*H01L 33/32* (2010.01)

(58) Field of Classification Search
CPC .............................. H01L 29/122–158; H01L 31/035236–035263; H01L 33/04–06
See application file for complete search history.

(56) References Cited

U.S. PATENT DOCUMENTS

| | | | |
|---|---|---|---|
| 2008/0054248 A1* | 3/2008 | Chua | H01L 21/0237 257/14 |
| 2010/0187496 A1* | 7/2010 | Yan | H01L 33/12 257/13 |
| 2011/0168670 A1 | 7/2011 | Wu et al. | |
| 2011/0243172 A1* | 10/2011 | Lin | B82Y 20/00 372/45.012 |
| 2013/0008508 A1* | 1/2013 | Sonoda | H01L 31/1852 136/262 |
| 2014/0191187 A1* | 7/2014 | Zhang | H01L 33/24 257/13 |
| 2015/0083994 A1* | 3/2015 | Jain | H01L 33/007 257/13 |
| 2017/0084697 A1* | 3/2017 | Bavard | H01L 29/155 |

FOREIGN PATENT DOCUMENTS

| | | |
|---|---|---|
| JP | H10270756 A | 10/1998 |
| WO | 2014118162 A1 | 8/2014 |

\* cited by examiner 0.0              5.0 μm

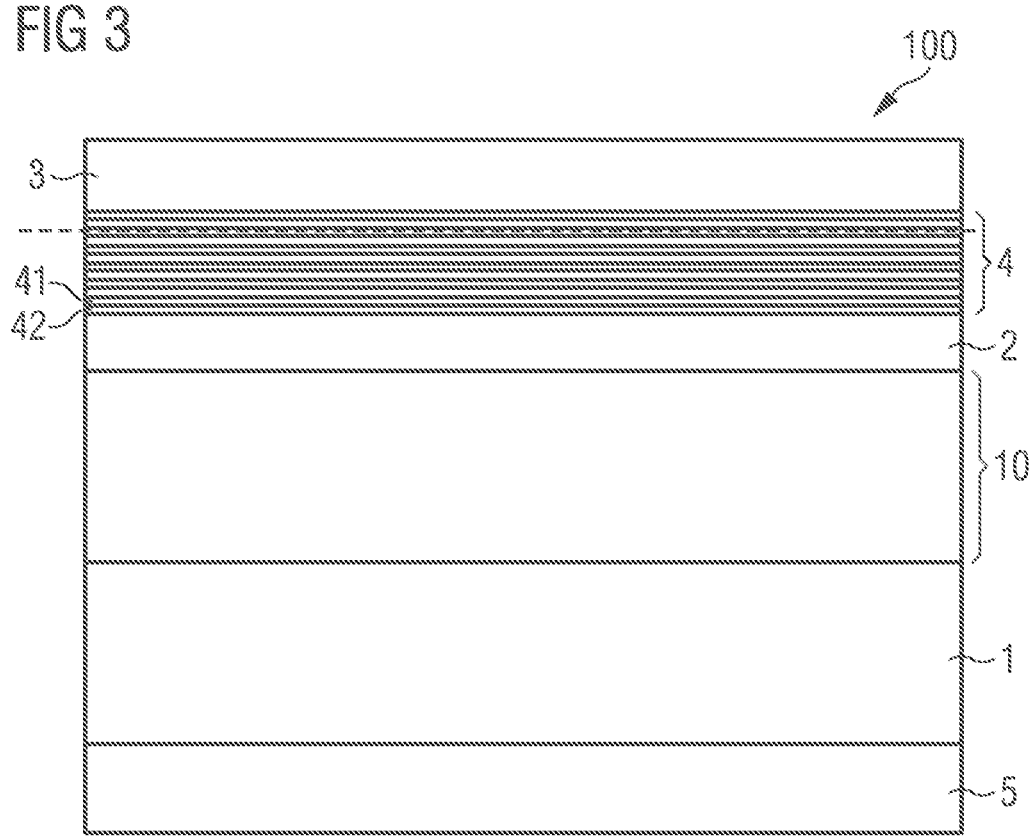

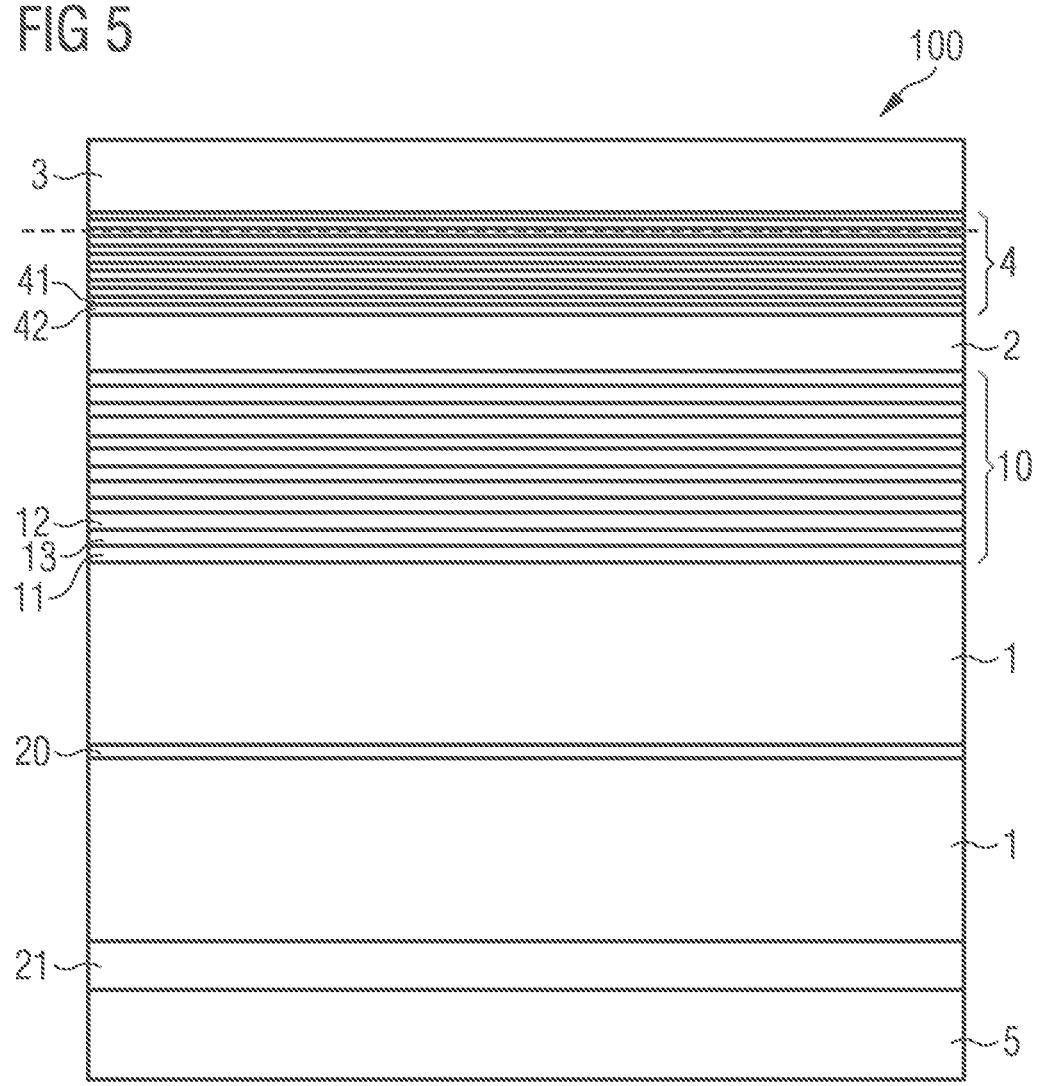

SEMICONDUCTOR LAYER SEQUENCE AND METHOD FOR PRODUCING A SEMICONDUCTOR LAYER SEQUENCE

This patent application is a national phase filing under section 371 of PCT/EP2017/077126, filed Oct. 24, 2017, which claims the priority of German patent application 102016120335.1, filed Oct. 25, 2016, each of which is incorporated herein by reference in its entirety.

TECHNICAL FIELD

A semiconductor layer sequence and a method for producing a semiconductor layer sequence are specified.

SUMMARY OF THE INVENTION

Embodiments provide a nitride-based semiconductor layer sequence that has a high quantum efficiency during operation. Further embodiments provide a method for producing such a semiconductor layer sequence.

According to at least one embodiment, the semiconductor layer sequence comprises a first nitridic compound semiconductor layer, an intermediate layer, a second nitridic compound semiconductor layer and an active layer, which are grown one above the other and one after the other in this order and which are directly adjacent to each other. "Directly adjacent to each other" means in particular that no further layers are arranged between the layers mentioned. The intermediate layer is thus located between the first and second nitridic compound semiconductor layer and is in direct contact with them. The second nitridic compound semiconductor layer is located between the intermediate layer and the active layer and is in direct contact with them.

The layers may themselves comprise or consist of a plurality of different individual layers.

In addition to the nitridic compound semiconductor layers, the intermediate layer and/or the active layer preferably also comprise or consist of a nitride compound semiconductor material. A nitride compound semiconductor material is defined as a semiconductor material comprising or consisting of $Al_n In_m Ga_{1-n-m} N$, wherein $0 \leq n \leq 1$, $0 \leq m \leq 1$ and $n+m \leq 1$. This material does not necessarily have to have a mathematically exact composition according to the above formula. Rather, it may, for example, contain one or more dopants and additional components. For the sake of simplicity, however, the above formula contains only the essential components of the crystal lattice, i.e., Al, Ga, In and N, even if these may be partially replaced and/or supplemented by small amounts of other substances.

Preferably, the active layer generates electromagnetic radiation in the UV range and/or in the visible blue spectral range during the intended operation.

The layers are preferably epitaxially grown on a growth substrate during a growth process. For epitaxial growth, chemical vapor deposition (CVD), such as MOCVD or PECVD, or physical vapor deposition, such as molecular beam epitaxy (MBE), can be used.

According to at least one embodiment, the intermediate layer has or consists of an AlGaN layer with an Al content of at least 2% or at least 5% or at least 10% or at least 15% or at least 20% or at least 25% or at least 30%. This means that the intermediate layer can comprise one or more sublayers of AlGaN or be formed entirely of AlGaN.

AlGaN means that this material is free of In within the limits of manufacturing tolerance. The idealized stoichiometric composition is then $Al_n In_m Ga_{1-n-m} N$ with $0 \leq n \leq 1$, $m=0$. An Al content of at least 5% means in particular that $n \leq 0.05$. An Al content of at least 10% means in particular that $n \leq 0.1$ and so on.

The intermediate layer preferably has a total thickness of at least 1 nm or 10 nm or 50 nm or 100 nm or 200 nm. Alternatively or additionally, the total thickness of the intermediate layer is at most woo nm or at most 700 nm or at most 500 nm. The total thickness of the intermediate layer corresponds to the distance between the first and the second nitridic compound semiconductor layer.

The intermediate layer is, for example, at least partially relaxed, for example, to a significant proportion or completely. In this case, the lattice constant essentially corresponds to the lattice constant of the unstressed intermediate layer material. This means that the lattice constant of the intermediate layer is preferably smaller than the lattice constant of the first and especially the second nitridic compound semiconductor layer.

According to at least one embodiment, the second nitridic compound semiconductor layer has a lower proportion of Al than the AlGaN layer of the intermediate layer or than the entire intermediate layer, such that the relaxed lattice constants of the AlGaN layer and of the second nitridic compound semiconductor layer differ. The second nitridic compound semiconductor layer can be free of Al and/or In within the manufacturing tolerance. For example, the second nitridic compound semiconductor layer consists of GaN. Alternatively, the Al content in the second nitridic compound semiconductor layer is at most 2% or at most 1%. The Al content in the second nitridic compound semiconductor layer is preferably at most 50% or at most 30% or at most 10% of the Al content of the AlGaN layer of the intermediate layer.

For example, the second nitridic compound semiconductor layer has a total thickness of at least 2 nm or at least 10 nm or at least 20 nm or at least 50 nm or at least 100 nm or at least 500 nm. Alternatively or additionally, the total thickness of the second nitridic compound semiconductor layer is at most 5000 nm or 2500 nm or 1500 nm or 1000 nm. The total thickness of the second nitridic compound semiconductor layer corresponds to the distance between the active layer and the intermediate layer.

For the first nitridic compound semiconductor layer, the same material composition and/or total thickness can be selected as specified for the second nitridic compound semiconductor layer.

Relaxed lattice constants are the lattice constants in the relaxed state, i.e., in a state in which no tensions occur in the crystal lattice. In this state, the lattice constants would occupy their ground state in which the lattice energy is minimized. For a number of nitride compound semiconductor materials, the relaxed lattice constants (a; c) are given in the table below, where a and c are given in Angstroms (Å).

| | |
|---|---|
| AlN | (3.112; 4.981) |
| $Al_{0.1}Ga_{0.9}N$ | (3.181; 5.165) |
| GaN | (3.189; 5.185) |
| $In_{0.05}Ga_{0.95}N$ | (3.207; 5.212) |
| InN | (3.544; 5.718) |

The values given in the table are at least partially extrapolated, so they may differ from the actual relaxed lattice constants. The actual lattice constants also depend on defect density and contaminant concentration. The main purpose of the table is to illustrate that the relaxed lattice constants are reduced with increasing Al content. An increasing Ga content and/or an increasing In content increase the relaxed lattice constants.

According to at least one embodiment, the second nitridic compound semiconductor layer and the active layer are grown on the intermediate layer lattice-matched, i.e., pseudomorphically, as a result of which tension occurs at least in the intermediate layer or the second nitridic compound semiconductor layer. This means that during the growth process, the second nitridic compound semiconductor layer grows, within the limits of manufacturing tolerance, based on the lattice constant of the intermediate layer. The active layer grows, within the limits of manufacturing tolerance, based on the lattice constant of the second nitridic compound semiconductor layer. This means that tensions can also occur in the active layer.

In this case and in the following it is understood by "lattice-matched" or "pseudomorph" that the crystal lattice is completely lattice-matched as well as that the crystal lattice is only partially lattice-matched. Partially lattice-matched means, for example, that a certain part of the crystal lattice, e.g., at least 50% or at least 70% or at least 90% of the space volume of the crystal lattice, is completely lattice-matched. In particular, the crystal lattice may be slightly or partially relaxed after pseudomorphic or lattice-matched growth. The pseudomorphically grown crystal lattice can thus take a state between relaxed and fully stressed.

With lattice-matched or pseudomorphic growth, an expansion of the lattice constant in the lateral direction, i.e., parallel to the main directions of the layers, is maintained. An expansion of the lattice constant perpendicular to the lateral direction can change due to the atomic compounds in the crystal and the resulting forces, whereby the Poisson's ratio can describe the above expansion.

The lattice-matched or pseudomorphic growth can be controlled, influenced and/or regulated by process parameters during the growth process on the intermediate layer. Due to the fact that the lattice constants within the different layers differ from each other in the relaxed state, but have grown on each other in a lattice-matched manner, one or more of the layers must be subjected to tensions, in particular tensions in the lateral direction.

According to at least one embodiment, the active layer comprises or consists of one or more layers of AlInGaN. The In content in each of these layers of AlInGaN is at most 12% or at most 10% or at most 7% or at most 5% or at most 3% or at most 1%. The AlInGaN layers, for example, are free of Al within the limits of manufacturing tolerance. In this case, the layers are InGaN layers. The idealized stoichiometric composition of the InGaN layers in the active layer is preferably $Al_nIn_mGa_{1-n-m}N$ with n=0, 0≤m≤1, wherein depending on the In content m≤0.12 or m≤0.1 or m≤0.07 or m≤0.05 and so on.

However, the In content in the AlInGaN layers of the active layer is preferably at least 0.1% or at least 0.5%.

In at least one embodiment, the semiconductor layer sequence comprises a first nitridic compound semiconductor layer, an intermediate layer, a second nitridic compound semiconductor layer, and an active layer grown one above the other and one after the other in this order and directly adjacent to each other, wherein the intermediate layer comprises or consists of an AlGaN layer having an Al content of at least 5%. The second nitridic compound semiconductor layer has a lower proportion of Al than the AlGaN layer, so that the relaxed lattice constants of the AlGaN layer and the second nitridic compound semiconductor layer differ. The second nitridic compound semiconductor layer and the active layer are grown on the intermediate layer in a lattice-matched manner, as a result of which at least in the intermediate layer or the second nitridic compound semiconductor layer a tension of the crystal lattice occurs. The active layer has one or more layers of AlInGaN and in each of these layers of AlInGaN the In content is at most 12%.

Embodiments of the invention are based, inter alia, on the recognition that the internal quantum efficiency of optoelectronic semiconductor chips with AlInGaN-based active layers shows a maximum when the In content is approximately between 8% and 12% inclusive. The reason for this is that during pseudomorphic growth of the active AlInGaN layer on the underlying semiconductor material, which is usually made of GaN, tensions must form in the AlInGaN layer. This is due to the different relaxed lattice constants. However, this in turn leads to an increased formation of alloy disorder during the growth of the AlInGaN layers and the formation of regions in which In accumulates. The consequence of these In accumulations are lateral potential fluctuations and potential fields within the active layer.

During operation of the semiconductor layer sequence, these potential fields result in localization of the charge carriers and the associated shielding of the charge carriers from imperfections, defects and impurities in the crystal lattice. This advantageously reduces the proportion of non-radiative recombination and thus increases the internal quantum efficiency.

If the In content in the active layer is further increased, i.e., beyond 12%, the differences in the relaxed lattice constants of the AlInGaN layers and the underlying GaN layers become so great that during lattice-matched growth segregations occur in the active layer, which in turn form non-radiating recombination centers. The internal quantum efficiency decreases accordingly.

If, on the other hand, the In content is reduced below 10%, for example, in order to shift the spectral range into the ultraviolet, the relaxed lattice constants of the active layer and the underlying semiconductor material are already strongly adapted, so that the tensions in the active layer decrease and the accumulation of indium and the associated lateral potential fields decrease. The localization of the charge carriers and the shielding of defects thus decrease, so that the internal quantum efficiency decreases.

Embodiments of the invention make use, inter alia, of the idea of specifically increasing the probability of accumulations or alloy disorder during the growth of the active layer. This is achieved by selectively introducing material fluctuations or layer thickness fluctuations or composition fluctuations into the second nitridic compound semiconductor layer adjacent to the active layer. In particular, by using an intermediate layer described here, it can be achieved that the second nitridic compound semiconductor layer exhibits tensions and/or surface structures. Due to these material fluctuations, the growth of the AlInGaN-based active layer leads to the desired In accumulations and thus to an increased localization of the charge carriers. The non-radiative recombination of the charge carriers is thus reduced and the quantum efficiency increased. Thus, a high internal quantum efficiency is achieved even with a low In content in the active layer. This enables highly efficient LEDs in the near UV range or in the blue spectral range.

According to at least one embodiment, the intermediate layer comprises at least one first layer of $Al_aIn_bGa_{1-a-b}N$ with 0≤a≤1, 0<b≤1 and a+b≤1. In addition, the intermediate layer comprises a second layer of $Al_cIn_dGa_{1-c-d}N$ with 0<c≤1, 0≤d≤1 and c+d≤1. The selected values are a<c and b>d. In other words, the intermediate layer comprises a first layer and a second layer, wherein the proportion of indium in the first layer is greater than in the second layer. In the second layer, the proportion of aluminum is greater than in the first layer.

According to at least one embodiment, the individual layers of the intermediate layer, in particular the first and second layer, are grown in a lattice-matched manner with respect to one another, so that the layers of the intermediate layer are at least partially stressed. Due to the different proportions of aluminum and indium in the two layers, particularly the lateral lattice constants of the two layers are different in the relaxed state. If these two layers are now grown on top of each other in a lattice-matched manner, at least one of the two layers will be stressed.

According to at least one embodiment, the intermediate layer is grown in a lattice-matched manner on the first nitridic compound semiconductor layer. The first nitridic compound semiconductor layer can, for example, be formed from GaN.

In particular, the lattice constants, especially the lateral lattice constants, in the intermediate layer follow the lattice constant in the first nitridic compound semiconductor layer. Due to the varying tensions within the intermediate layer, a surface structure is formed when the intermediate layer is grown. The intermediate layer is therefore not flat after growth, especially on the surface facing the active layer, but has a surface structure. In particular, hills or valleys or elevations and depressions form in the intermediate layer during growth, which also remain in the finished semiconductor layer sequence.

For example, the elevations and/or depressions have a lateral expansion of at least 10 nm or 50 nm or 100 nm or 500 nm or 1 μm in average. Alternatively or additionally, the mean lateral extent of the elevations and/or depressions is at most 5 μm or at most 2 μm or at most 1 μm.

The subsequently pseudomorphically grown second nitridic compound semiconductor layer follows the surface structure of the intermediate layer. When the active layer is grown on the structured second nitridic compound semiconductor layer, this structure leads to an uneven growth of In and thus to the desired In accumulations.

In the case that the first nitridic compound semiconductor layer is formed from GaN, the subsequent layers, in particular the intermediate layer and the second nitridic compound semiconductor layer, have a lattice constant largely adapted to GaN. The active layer with the low In content has a relaxed lateral lattice constant which, depending on the In content, differs only slightly or insignificantly from the GaN lattice constant. This means that the active layer can grow on the second nitridic compound semiconductor layer with only slight tensions. The desired accumulation of In is nevertheless achieved thanks to the surface structure of the intermediate layer and the resulting surface structure of the second nitridic compound semiconductor layer.

According to at least one embodiment, a third layer of GaN is disposed between the first layer and the second layer of the intermediate layer and is in direct contact with the first layer and the second layer. The third layer comprises neither Al nor In within the manufacturing tolerance. Preferably, the third layer is also grown in a lattice matched manner with respect to the first and second layer.

According to at least one embodiment, the intermediate layer comprises or consists of a superlattice with alternately arranged layers of InGaN or GaN and AlGaN. The InGaN layers or GaN layers preferably do not contain aluminum within the limits of manufacturing tolerance, whereas the AlGaN layers preferably do not contain indium within the limits of manufacturing tolerance. Between an InGaN layer and an AlGaN layer, for example, there may be a GaN layer which, within the limits of manufacturing tolerance, does not contain indium or aluminum.

The intermediate layer preferably comprises a plurality of directly consecutive GaN/AlGaN/GaN/InGaN layer sequences. For example, the intermediate layer comprises or consists of at least five or at least ten or at least 20 or at least 40 of said GaN/AlGaN/GaN/InGaN layer sequences.

The thickness of the InGaN layers in the intermediate layer is in each case, for example, between 0.5 nm and 4 nm inclusive. For example, the thickness of the AlGaN layers in the intermediate layer is in each case between 0.5 nm and 10 nm inclusive. The thickness of the GaN layers in the intermediate layer is in each case, for example, between 0.5 nm and 4 nm inclusive.

The Al content in the AlGaN layers of the intermediate layer is particularly preferably between 5% and 80% inclusive. The In content in the InGaN layers of the intermediate layer is preferably between 0.1% and 5% inclusive.

Such a superlattice in the intermediate layer allows a particularly pronounced surface structure to be achieved on the side of the intermediate layer facing the active layer.

According to at least one embodiment, the distance between the intermediate layer and the active layer, in particular between the superlattice and the active layer, is at most 500 nm or at most 400 nm or at most 200 nm or at most 100 nm or at most 50 nm or at most 10 nm. The distance between the intermediate layer and the active layer is preferably filled exclusively by the second nitridic compound semiconductor layer. For example, the second nitridic compound semiconductor layer can consist of GaN, which contains neither Al nor In within the limits of manufacturing tolerance. Alternatively, it is also possible that the second nitridic compound semiconductor layer comprises or consists of a layer of InGaN and a layer of GaN or a layer of AlGaN.

The choice of a thin second nitridic compound semiconductor layer ensures that the surface structures formed by the intermediate layer are transferred to the active layer. A thick second nitridic compound semiconductor layer, on the other hand, could wash out the surface structures of the intermediate layer. On the other hand, the arrangement of the second nitridic compound semiconductor layer between the active layer and the intermediate layer is advantageous in order to reduce adverse influences of the Al-containing intermediate layer on the active layer. For example, a layer with a high Al content in the direct vicinity or direct contact to the active layer can significantly increase the tension in a first quantum well of the active layer and thus can negatively influence the emission wavelength or the quality of the first quantum well and hinder the injection of electrons. In addition, the Al of the intermediate layer could then act as an impurity or surfactant (surface active agent) in the quantum well.

According to at least one embodiment, the active layer reproduces a surface structure of the surface of the intermediate layer facing the active layer. The mean roughness of a surface of the active layer is then, for example, at least 0.5 nm or at least 1 nm or at least 2 nm. A surface of the active layer can be either the surface of the active layer adjacent to the second nitridic compound semiconductor layer or the opposite surface delimiting the active layer. The mean roughness $R_a$ of a surface is calculated as follows:

$$R_a = \frac{1}{MN} \sum_{m=1}^{M} \sum_{n=1}^{N} |z(x_m, y_n) - \langle z \rangle| \text{ wherein } \langle z \rangle = \frac{1}{MN} \sum_{m=1}^{M} \sum_{n=1}^{N} |z(x_m, y_n)|$$

Where x,y are the coordinates in the lateral direction and z(x,y) is the height or depth, measured perpendicular to the lateral direction at the x,y-coordinate.

According to at least one embodiment, the first and second nitridic compound semiconductor layer consist of GaN.

According to at least one embodiment, the intermediate layer is formed from AlGaN. For example, the Al content in the intermediate layer is at least 5% or at least 10% or at least 15% or at least 20% or at least 25% or at least 30%. The intermediate layer is then preferably free of In within the limits of manufacturing tolerance.

According to at least one embodiment, the intermediate layer is grown in a non-lattice-matched or non-pseudomorphic manner on the first nitridic compound semiconductor layer. This means that the intermediate layer does not adapt its lateral lattice constant to the lateral lattice constant of the nitridic compound semiconductor layer when growing on the first nitridic compound semiconductor layer. Rather, the intermediate layer relaxes or partially relaxes when growing onto the first nitridic compound semiconductor layer. This can be achieved by adjusting the process parameters during growth.

In this context, process parameters are process parameters that can be regulated, varied and/or controlled before, during or after the growth of a semiconductor layer. For example, pressure, temperature, gas flow of the individual elements of the nitride compound semiconductor materials used, flow velocity and/or growth rate and/or growth velocity are possible process parameters that can influence the lattice-matched or non lattice-matched growth of the layers described here.

According to at least one embodiment, the intermediate layer has an Al content which is greater than the Al content of the first and/or second nitridic compound semiconductor layer. For example, the first and/or second nitridic compound semiconductor layers are free of Al within the limits of manufacturing tolerance or have an Al content of at most 50% or at most 30% or at most 10% of the Al content in the intermediate layer. For example, the first and/or second nitridic compound semiconductor layer consists of GaN.

The second nitridic compound semiconductor layer is preferably compression-stressed after growing onto the intermediate layer and also remains compression-stressed in the finished semiconductor layer sequence. The second nitridic compound semiconductor layer has a larger lateral lattice constant than the intermediate layer due to the lower Al content. The lattice-matched growth on the intermediate layer forces the second nitridic compound semiconductor layer and the active layer into a compressive tension. These tensions ensure that alloy disorders are formed during the growth of the active layer, i.e., that In accumulations occur.

However, the lower the In content in the AlInGaN layers of the active layer, the lower is the lateral relaxed lattice constant in these AlInGaN layers. In order to keep the tensions in the active layer high, it is advantageous to select a higher Al content in the intermediate layer the lower the In content in the active layer is.

For an In content between 5% and 7% inclusive in the AlInGaN layers of the active layer, the Al content in the intermediate layer is preferably chosen such that the lattice constant of the second nitridic compound semiconductor layer corresponds to the lattice constant of an AlGaN lattice with an Al content between 10% and 20% inclusive. With an In content in the AlInGaN layers between 3% and 5% inclusive, the Al content in the intermediate layer is preferably chosen such that the lattice constant of the second nitridic compound semiconductor layer corresponds to the lattice constant of an AlGaN lattice with an Al content between 20% and 30% inclusive. For an In content in the AlInGaN layers between 1% and 3% inclusive, the Al content in the intermediate layer is preferably chosen so that the lattice constant of the second nitridic compound semiconductor layer corresponds to the lattice constant of an AlGaN lattice with an Al content between 30% and 40% inclusive and for an In content of less than 1% in the AlInGaN layers, the Al content in the intermediate layer is preferably chosen so that the lattice constant of the second nitridic compound semiconductor layer corresponds to the lattice constant of an AlGaN lattice having an Al content of at least 40%.

According to at least one embodiment, the Al content in the intermediate layer is chosen such that the relative lattice constant mismatch $\Delta$ of the AlInGaN layers of the active layer is between $-0.5\%$ and $-2.5\%$ inclusive, preferably between $-0.8\%$ and $-2.0\%$ inclusive, more preferably between $-1.0\%$ and $-1.3\%$ inclusive. The relative lattice constant mismatch $\Delta$ is calculated as follows:

$$\Delta = \frac{(G_b - G_a)}{G_a} \times 100$$

$G_a$ is the unstressed lateral lattice constant of the AlInGaN layers of the active layer. $G_b$ is the unstressed lattice constant of an AlGaN layer.

According to at least one embodiment, a distance between the intermediate layer and the active layer is at most 2.5 µm or at most 2 µm or at most 1 µm or at most 0.5 µm. Alternatively or additionally, the distance is at least 10 nm or at least 20 nm or at least 50 nm or at least 100 nm or at least 500 nm According to at least one embodiment, a growth substrate of the semiconductor layer sequence is a sapphire substrate. The growth of nitride semiconductor layers on sapphire takes place predominantly without tension in the active layer. Nevertheless, embodiments of the invention here deliberately introduces tensions through the intermediate layer in order to increase the In accumulations in the active layer at low In content.

According to at least one embodiment, a growth substrate of the semiconductor layer sequence is a pre-structured substrate. In other words, a growth side of the substrate on which the semiconductor layer sequence is grown has a targeted and predetermined structure.

The growth substrate is not part of the semiconductor layer sequence. In later processing, for example, to a semiconductor chip for an LED, the growth substrate can remain on the semiconductor layer sequence or can be removed. However, which growth substrate was used can still be traced after removal.

According to at least one embodiment, the active layer comprises one or more quantum wells made of AlInGaN with an In content of at most 12% each. Barriers may be formed between the quantum wells comprising AlGaN with an Al content of at least 5%. In other words, the active layer is then formed as a single quantum well structure, SQW for short, or as a multi quantum well structure, MQW for short. The individual layers of the active layer are also preferably lattice-matched or pseudomorphically grown on top of each other.

In addition, an optoelectronic semiconductor chip is specified. For example, the semiconductor chip comprises a semiconductor layer sequence described herein. All features disclosed in connection with the semiconductor layer sequence are therefore also disclosed for the optoelectronic semiconductor chip and vice versa.

According to at least one embodiment, the optoelectronic semiconductor chip comprises a semiconductor layer sequence described herein. Preferably, the active layer of the semiconductor chip generates electromagnetic radiation during intended operation.

According to at least one embodiment, the maximum intensity of the radiation generated in the active layer is between 365 nm and 415 nm.

In addition, a method for producing a semiconductor layer sequence is specified. The method is particularly suitable for the production of a semiconductor layer sequence described herein. All features disclosed in connection with the semiconductor layer sequence described above are therefore also disclosed for the method and vice versa.

According to at least one embodiment, the method comprises a step A) in which a growth substrate is provided.

In a step B), a first nitridic compound semiconductor layer is grown on the growth substrate.

In a step C), an intermediate layer is grown on a side of the first nitridic compound semiconductor layer facing away from the growth substrate, wherein the intermediate layer comprises or consists of an AlGaN layer with an Al content of at least 5%.

In a step D), a second nitridic compound semiconductor layer is grown on a side of the intermediate layer facing away from the growth substrate in a lattice-matched manner. The second nitridic compound semiconductor layer has a lower proportion of Al than the AlGaN layer of the intermediate layer, such that the relaxed lattice constants of the AlGaN layer and the second nitridic compound semiconductor layer differ.

In a step E), an active layer is grown on a side of the second nitridic compound semiconductor layer facing away from the growth substrate in a lattice-matched manner. The active layer comprises one or more layers of AlInGaN and in each of these layers of AlInGaN the content of In is at most 12%.

According to at least one embodiment, the steps A) to E) are performed one after the other in the specified order.

BRIEF DESCRIPTION OF THE DRAWINGS

In the following, a semiconductor layer sequence described herein is described in more detail with reference to the drawings by means of exemplary embodiments. Here, like reference numerals indicate like elements in the figures. However, the size ratios involved are not to scale, individual elements may rather be illustrated with an exaggerated size for a better understanding.

FIG. 3 shows another exemplary embodiment of a semiconductor layer sequence in cross-sectional view, FIGS. 5 and 6 show further exemplary embodiments of semiconductor layer sequences in cross-sectional view.

DETAILED DESCRIPTION OF ILLUSTRATIVE EMBODIMENTS

Figure 1A:
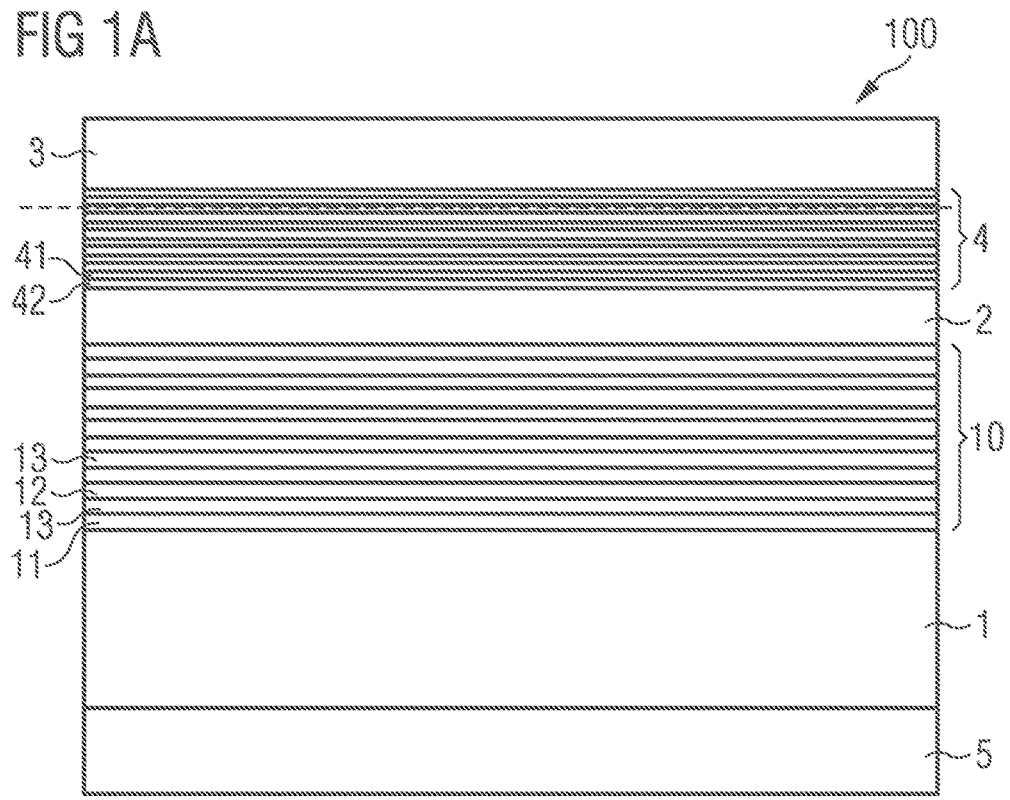
FIG. 1A shows an exemplary embodiment of a semiconductor layer sequence in cross-sectional view.

FIG. 1A shows a semiconductor layer sequence 100 in cross-sectional view. The semiconductor layer sequence 100 is grown on a growth substrate 5, for example, a sapphire substrate or a silicon substrate or a structured substrate (for example, PSS). The semiconductor layer sequence 100 is a GaN-based semiconductor layer sequence.

The semiconductor layer sequence 100 comprises a first nitridic compound semiconductor layer 1. An intermediate layer 10 is grown on a side of the first nitridic compound semiconductor layer 1 facing away from the growth substrate 5. The intermediate layer 10 is followed by a second nitridic compound semiconductor layer 2. The second nitridic compound semiconductor layer 2 is followed by an active layer 4. The active layer 4, in turn, is followed by a third nitridic compound semiconductor layer 3.

The first 1, second 2 and third 3 nitridic compound semiconductor layers, for example, are made of GaN and have neither indium nor aluminum within the limits of manufacturing tolerance. For example, the second nitridic compound semiconductor layer 2 is n-doped, the third nitridic compound semiconductor layer 3 is p-doped.

The intermediate layer 10 in FIG. 1A consists of a superlattice of several individual layers. A first layer 11 of the superlattice consists of InGaN. This is followed by a third layer 13 consisting of GaN. The third layer 13 is followed by a second layer 12 of AlGaN. A third layer 13 of GaN is arranged next to it. Layers 11, 12, 13 border directly on each other. For example, each of these individual layers has a thickness between 5 nm and 50 nm inclusive. The InGaN/GaN/AlGaN/GaN layer sequence is repeated several times in the intermediate layer 10, for example, at least ten times or at least 20 times. In this way, an InGaN/GaN/AlGaN/GaN superlattice is formed which forms the intermediate layer 10. Each of the individual layers from the intermediate layer 10 is lattice-matched or pseudomorphically grown onto the previous individual layer.

The intermediate layer 10 is grown on the first nitridic compound semiconductor layer 1 in a lattice-matched manner. This means that the lateral lattice constants in the intermediate layer 10 are adapted to the lateral lattice constants of the first nitridic compound semiconductor layer 1. However, since the material compositions of the individual layers of the intermediate layer 10 differ in part from the material composition of the first nitridic compound semiconductor layer 1, tensions occur within the intermediate layer 10. These tensions lead to the formation of structures with elevations and depressions when the intermediate layer 10 grows. A surface of the intermediate layer 10 facing the active layer 4 thus shows a surface structure after growth.

For example, the second nitridic compound semiconductor layer 2 downstream of the intermediate layer 10 has a thickness of at most 500 nm and reshapes the surface structure of the intermediate layer 10. Likewise, the active layer 4, which is arranged downstream of the second nitridic compound semiconductor layer 2 and grown on top of it in a lattice-matched manner, reproduces the surface structure of the intermediate layer 10.

The active layer 4 in FIG. 1A consists of a multiple quantum well structure, wherein the individual quantum wells 41 consist of InGaN. Barriers 42 between InGaN quantum wells 41 can be AlGaN barriers. In the InGaN quantum wells 41, the In content is at most 12%.

Due to the surface structure of the intermediate layer 10 and the associated structure of the active layer 4, In accumulations occur in certain areas during the growth of the quantum wells 41 of the active layer 4. The associated potential fluctuations result in a localization of charge carriers and a shielding of defects within the active layer 4. This reduces the amount of non-radiative recombination within the active layer 4.

Figure 1B:
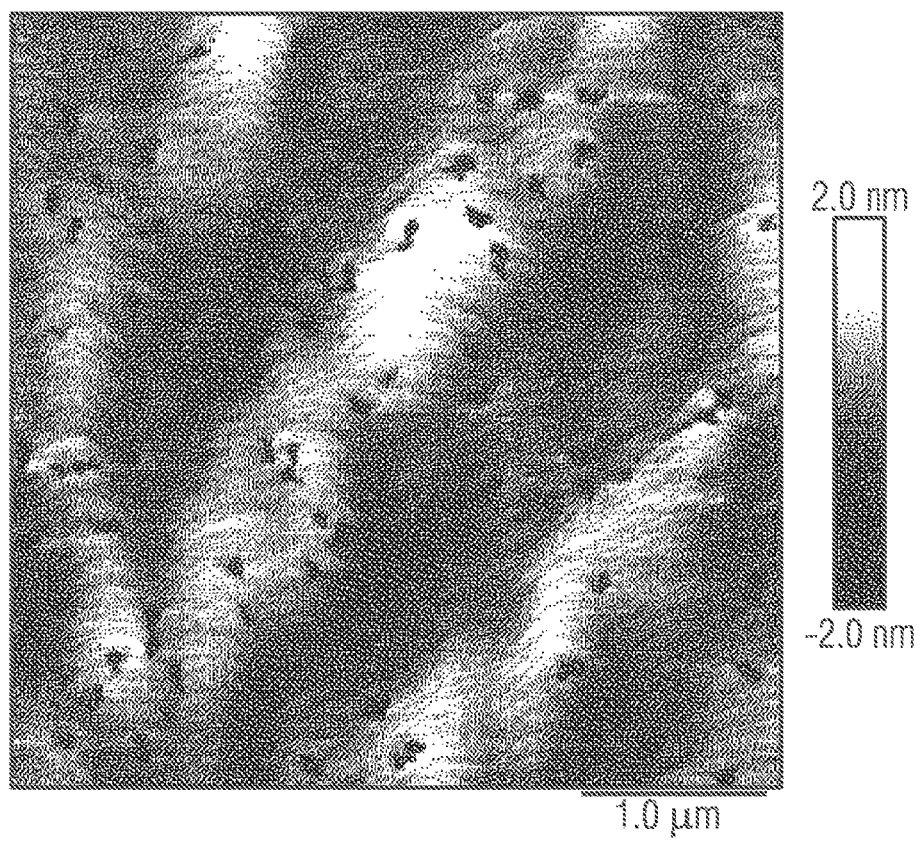
FIGS. 1B, 2A and 2B show AFM images of active layers of different semiconductor layer sequences.

FIG. 1B shows an AFM (atomic force microscope) image of the active layer 4. The image shows the surface of the active layer 4 exposed by a cut along the dashed line of FIG. 1A. A pronounced structure of the surface of the active layer 4 with a plurality of elevations and depressions can be seen. The mean roughness $R_a$ of the surface shown here, for example, is at least 0.5 nm.

Figure 2A:
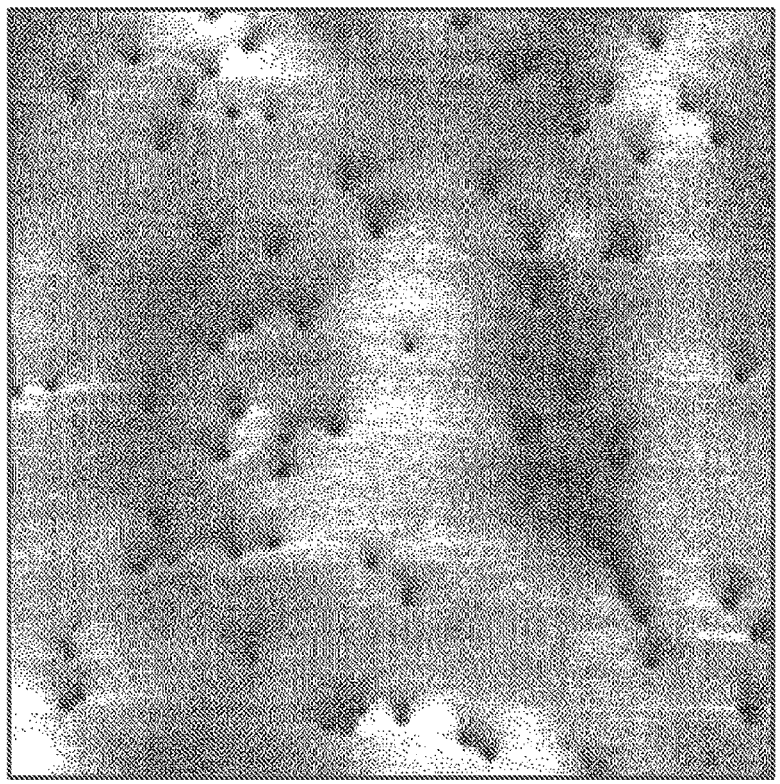
Figure 2B:
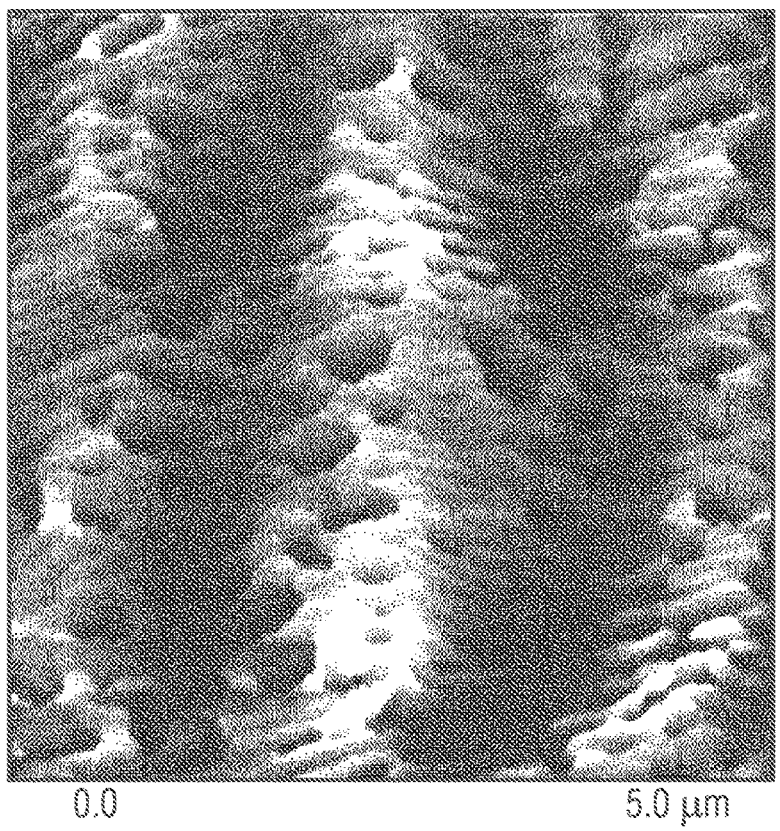

FIGS. 2A and 2B show two more AFM images of an active layer of a semiconductor layer sequence.

FIG. 2A shows a semiconductor layer sequence in which an intermediate layer 10 with a superlattice, as for example, described in FIG. 1A, is omitted. It can be seen that the photographed surface has only a small structure.

FIG. 2B, on the other hand, shows again the surface of an active layer 4 using an intermediate layer 10 with a superlattice. The structures within the active layer are much more pronounced than in FIG. 2A.

FIG. 3 shows another exemplary embodiment of a semiconductor layer sequence 100. In contrast to FIG. 1A, in FIG. 3 the intermediate layer 10 is not formed as a superlattice of a plurality of individual layers. Rather, in FIG. 3, the intermediate layer 10 is formed of AlGaN. The Al content in the intermediate layer 10, for example, is at least 5%.

The intermediate layer 10 in FIG. 3, for example, is not grown in a lattice-matched manner to the first nitridic compound semiconductor layer 1. This means that when the intermediate layer 10 is grown, the intermediate layer 10 relaxes partially or completely to its unstressed ground state, so that the lateral lattice constant within the intermediate layer 10 differs from the lateral lattice constant inside the first nitridic compound semiconductor layer 1.

The second nitridic compound semiconductor layer 2 is again grown on the intermediate layer 10 in a lattice-matched manner. Since the lattice constants in the second nitridic compound semiconductor layer 2 and the intermediate layer 10 differ in the relaxed state, the second nitridic compound semiconductor layer 2 is laterally stressed. The active layer 4 has also grown in a lattice-matched manner and is thus stressed. These tensions lead to In accumulations in some regions in the active layer 4, which result in localization of the charge carriers and prevent diffusion of the charge carriers to the defects within the active layer 4.

The intermediate layer 10 shown in FIG. 3 can also improve the quantum efficiency of the semiconductor layer sequence 100.

Figure 4A:
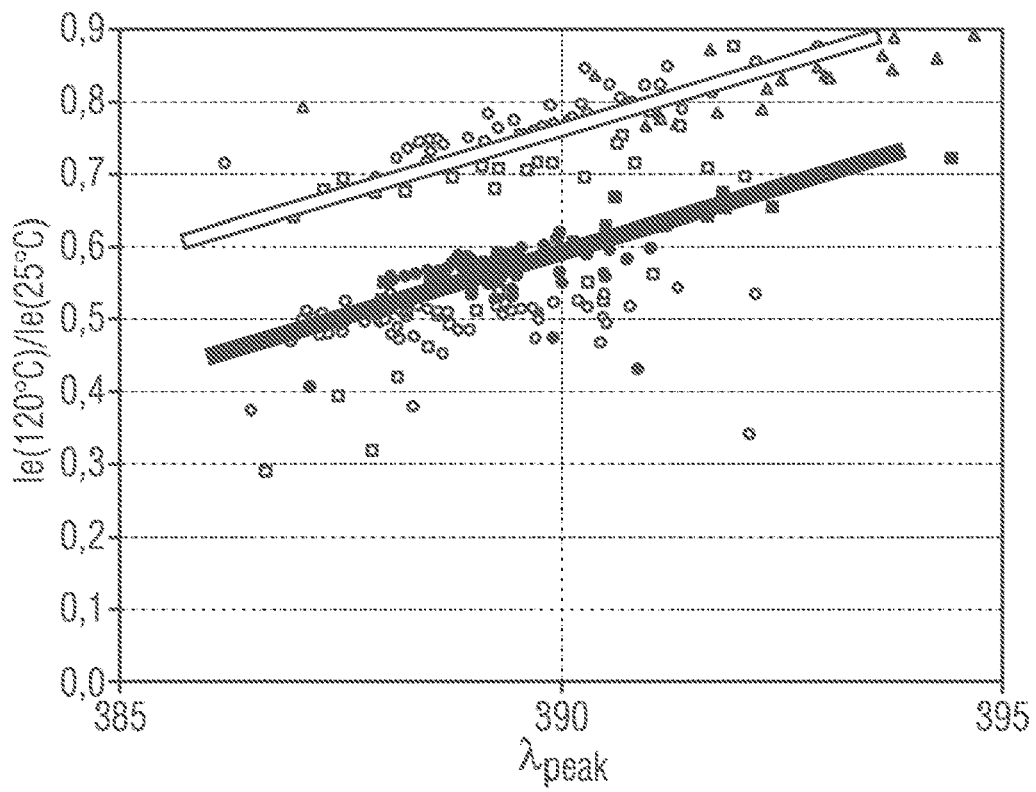
FIGS. 4A and 4B show measurement curves for the efficiency of different semiconductor layer sequences.
Figure 4B:
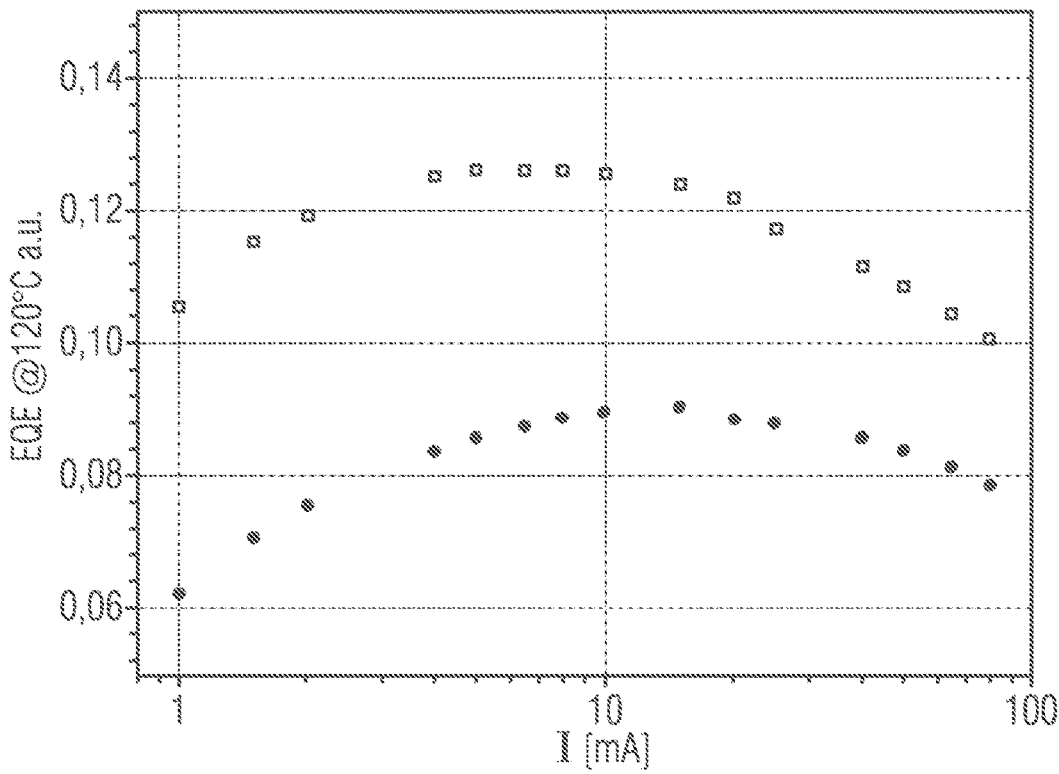

FIGS. 4A and 4B show efficiency measurements of semiconductor layer sequences 100 described herein.

FIG. 4A shows on the y-axis the ratio of the light output of a semiconductor layer sequence 100 at 120° C. to the light output of the same semiconductor layer sequence at 25° C. The x-axis shows the wavelength at the maximum intensity ($\lambda_{peak}$) of the light emitted by the active layer 4. The upper measuring points, through which the upper compensation line is drawn, show the measurement results for a semiconductor layer sequence 100 with an intermediate layer according to embodiments of the invention. The lower measuring points with the corresponding compensation line show the measuring points for a semiconductor layer sequence in which an intermediate layer according to embodiments of the invention is omitted.

It can clearly be seen that the intermediate layer 10 increases the temperature stability of the semiconductor layer sequence.

In FIG. 4B the y-axis shows the external quantum efficiency (EQE) at 120° C. The x-axis shows the current through the semiconductor layer sequence 100 in logarithmic representation in mA. The upper measuring point curve again shows the result of the measurement for a semiconductor layer sequence 100 according to embodiments of the invention with an intermediate layer 10 according to embodiments of the invention. The lower measuring point curve shows the result if the intermediate layer 10 is omitted. Again, it is evident that the intermediate layer can significantly increase efficiency, especially for small currents.

The exemplary embodiment of FIG. 5 differs from the exemplary embodiment of FIG. 1A in the structure of the first nitridic compound semiconductor layer 1. In contrast to FIG. 1A, the first nitridic compound semiconductor layer 1 in FIG. 5 is grown on a nucleation layer 21 based on AlGaN, for example. The nucleation layer 21 in turn is grown directly on the substrate 5. Further, the first nitridic compound semiconductor layer 1 comprises a masking layer 20 formed from silicon nitride, for example. The masking layer 20 and the nucleation layer 21 reduce tensions within the first nitridic compound semiconductor layer 1 during the growth of the first nitridic compound semiconductor layer 1.

Figure 6:
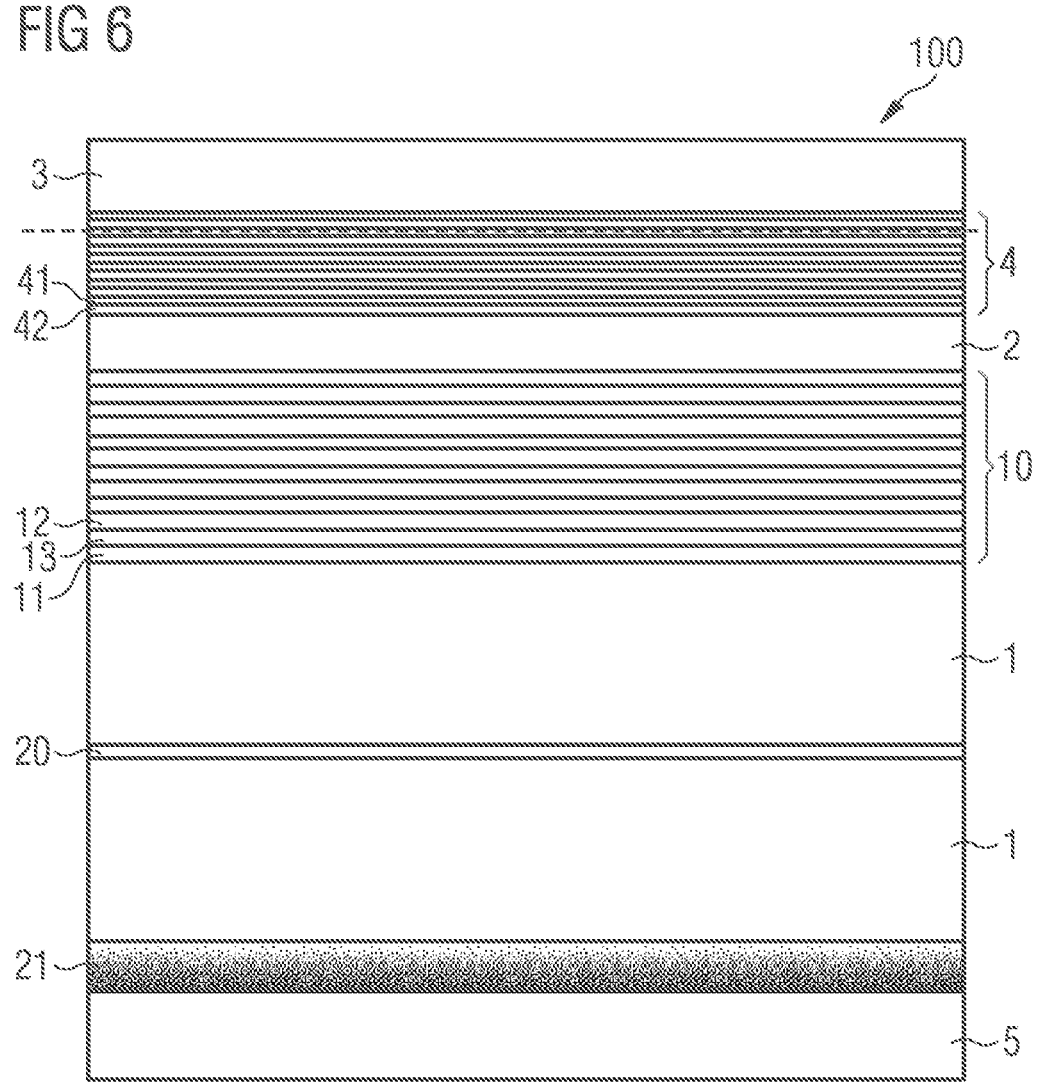

In the exemplary embodiment of FIG. 6, the semiconductor layer sequence 100 is grown on the (111)-surface of a silicon substrate 5, for example. The silicon substrate 5 is followed by a buffer layer 21 with an AlN/AlGaN layer sequence. On this buffer layer 21 the first nitridic compound semiconductor layer 1 again with the masking layer 20 is grown. Also here, the masking layer 20 and the buffer layer 21 ensure that tensions are reduced when the first nitridic compound semiconductor layer 1 is grown.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

The invention claimed is:
1. A semiconductor layer sequence comprising:
a first nitridic compound semiconductor layer;
an intermediate layer;
a second nitridic compound semiconductor layer; and
an active layer,
wherein these layers are grown one above the other and one after the other in the recited order and wherein these layers are directly adjacent to each other,
wherein the intermediate layer comprises an AlGaN layer with an Al content of at least 5%,
wherein the second nitridic compound semiconductor layer has a lower proportion of Al than the AlGaN layer such that relaxed lattice constants of the AlGaN layer of the intermediate layer and of the second nitridic compound semiconductor layer differ,
wherein the second nitridic compound semiconductor layer and the active layer are grown on the intermediate layer in a lattice-matched manner so that a tension of a crystal lattice occurs at least in the intermediate layer or the second nitridic compound semiconductor layer,
wherein the active layer comprises one or more layers of AlInGaN,
wherein an In content in each of the layers of AlInGaN is at most 12%,
wherein the intermediate layer comprises at least one first layer of $Al_aIn_bGa_{1-a-b}N$ with $0 \leq a \leq 1$, $0 < b \leq 1$ and $a+b \leq 1$ and at least one second layer of $Al_cIn_dGa_{1-c-d}N$ with $0<c\le1$, $0\le d\le1$ and $c+d\le1$, where $a<c$ and $b>d$ applies, wherein the individual layers of the intermediate layer are grown in a lattice-matched manner with respect to one another so that the layers of the intermediate layer are at least partially stressed, and wherein the intermediate layer is grown on the first nitridic compound semiconductor layer in a lattice-matched manner.

2. The semiconductor layer sequence according to claim 1, further comprising a third layer of GaN disposed between the first layer of $Al_aIn_bGa_{1-a-b}N$ and the second layer of $Al_cIn_dGa_{1-c-d}N$, wherein the third layer is in direct contact with the first layer of $Al_aIn_bGa_{1-a-b}N$ and the second layer of $Al_cIn_dGa_{1-c-d}N$.

3. The semiconductor layer sequence according to claim 1, wherein the intermediate layer comprises a superlattice having alternately arranged first layers of InGaN or GaN and second layers of AlGaN.

4. The semiconductor layer sequence according to claim 1, wherein a distance between the intermediate layer and the active layer is at most 500 nm.

5. The semiconductor layer sequence according to claim 1,
wherein the active layer reproduces a surface structure of a surface of the intermediate layer facing the active layer, and
wherein a mean roughness of a surface of the active layer is at least 0.5 nm.

6. The semiconductor layer sequence according to claim 1, wherein the first and second nitridic compound semiconductor layers consist essentially of GaN.

7. The semiconductor layer sequence according to claim 1,
wherein the intermediate layer is formed from AlGaN, and
wherein the intermediate layer is grown on the first nitridic compound semiconductor layer in a non-lattice-matched manner.

8. The semiconductor layer sequence according to claim 7,
wherein the intermediate layer has an aluminum content greater than an aluminum content of the second nitridic compound semiconductor layer, and
wherein the second nitridic compound semiconductor layer is compression-stressed.

9. The semiconductor layer sequence according to claim 1, wherein a distance between the intermediate layer and the active layer is at most 2.5 μm.

10. The semiconductor layer sequence according to claim 1, further comprising a growth substrate, wherein the growth substrate of the semiconductor layer sequence is a sapphire substrate.

11. The semiconductor layer sequence according to claim 1, further comprising a growth substrate, wherein the growth substrate of the semiconductor layer sequence is a pre-structured substrate.

12. The semiconductor layer sequence according to claim 1, wherein the active layer comprises one or more quantum wells of AlInGaN, each quantum well having an In content of at most 12%.

13. An optoelectronic semiconductor chip comprising:
the semiconductor layer sequence according to claim 1,
wherein the active layer is configured to generate electromagnetic radiation during operation, and
wherein a maximum intensity of the radiation produced in the active layer is between 365 nm and 415 nm inclusive.

14. A semiconductor layer sequence comprising:
a first nitridic compound semiconductor layer;
an intermediate layer;
a second nitridic compound semiconductor layer; and
an active layer,
wherein these layers are grown one above the other and one after the other in the recited order and wherein these layers are directly adjacent to each other,
wherein the intermediate layer consists essentially of an AlGaN layer with an Al content of at least 5%,
wherein the second nitridic compound semiconductor layer has a lower proportion of Al than the AlGaN layer such that relaxed lattice constants of the AlGaN layer of the intermediate layer and of the second nitridic compound semiconductor layer differ,
wherein the second nitridic compound semiconductor layer and the active layer are grown on the intermediate layer in a lattice-matched manner so that a tension of a crystal lattice occurs at least in the intermediate layer or the second nitridic compound semiconductor layer,
wherein the active layer comprises one or more layers of AlInGaN and an In content in each of these layers of AlInGaN is at most 12%, and
wherein the intermediate layer is grown on the first nitridic compound semiconductor layer in a non-lattice-matched manner.

15. The semiconductor layer sequence according to claim 14, wherein a distance between the intermediate layer and the active layer is at most 500 nm.

16. The semiconductor layer sequence according to claim 14, wherein a distance between the intermediate layer and the active layer is at most 2.5 μm.

17. The semiconductor layer sequence according to claim 14,
wherein the active layer reproduces a surface structure of a surface of the intermediate layer facing the active layer, and
wherein a mean roughness of a surface of the active layer is at least 0.5 nm.

18. The semiconductor layer sequence according to claim 14, wherein the first and second nitridic compound semiconductor layers consist essentially of GaN.

19. The semiconductor layer sequence according to claim 14, further comprising a growth substrate, wherein the growth substrate of the semiconductor layer sequence is a sapphire substrate.

* * * * *